United States Patent
Kawai

(10) Patent No.: US 8,567,052 B2
(45) Date of Patent: Oct. 29, 2013

(54) METHOD OF MANUFACTURING THROUGH ELECTRODE-ATTACHED GLASS SUBSTRATE AND METHOD OF MANUFACTURING ELECTRONIC COMPONENT

(75) Inventor: Noboru Kawai, Chiba (JP)

(73) Assignee: Seiko Instruments Inc. (JP)

( * ) Notice: Subject to any disclaimer, the term of this patent is extended or adjusted under 35 U.S.C. 154(b) by 228 days.

(21) Appl. No.: 13/135,495

(22) Filed: Jul. 7, 2011

(65) Prior Publication Data

US 2012/0005893 A1     Jan. 12, 2012

(30) Foreign Application Priority Data

Jul. 8, 2010   (JP) ................. 2010-156171

(51) Int. Cl.
*H01K 3/10*       (2006.01)

(52) U.S. Cl.
USPC ................. 29/852; 29/846; 29/856

(58) Field of Classification Search
USPC ............ 29/852, 829, 832, 846, 856, 874; 257/737, E23.068, E31.117, E31.127
See application file for complete search history.

(56) References Cited

U.S. PATENT DOCUMENTS

| | | | |
|---|---|---|---|
| 7,437,030 B2 * | 10/2008 | Asai et al. | 385/14 |
| 2010/0078810 A1 * | 4/2010 | Matsui et al. | 257/737 |

FOREIGN PATENT DOCUMENTS

| | | |
|---|---|---|
| JP | 2002121037 | 4/2002 |
| JP | 2002124845 | 4/2002 |
| JP | 2003209198 | 7/2003 |

* cited by examiner

*Primary Examiner* — Thiem Phan
(74) *Attorney, Agent, or Firm* — Adams & Wilks

(57) ABSTRACT

A method of manufacturing a through electrode-attached glass substrate includes: forming an effective unit cell by drilling a plurality of through holes in a unit cell with a minimum area acquired by cutting out and dividing plate-shaped glass being configured as the unit cell and distributing dummy unit cells in which the through hole is not formed in an area in which the effective unit cell is formed; inserting electrode members into the through holes; welding the plate-shaped glass and the electrode members by heating the plate-shaped glass at a temperature that is higher than a softening point thereof; and grinding both sides of the plate-shaped glass together with the electrode members so as to expose a plurality of the electrode members to both sides of the plate-shaped glass and configure the plurality of the electrode members as a plurality of through electrodes that are electrically separated from each other.

8 Claims, 8 Drawing Sheets

GLASS PREPARING SUB-PROCESS S1a

CONCAVE PORTION
FORMING SUB-PROCESS S1b

CONCAVE PORTION
FORMING SUB-PROCESS S1c

PASS-THROUGH SUB-PROCESS S1c

ELECTRODE INSERTING PROCESS S2

HEATING AND
PRESSURIZING SUB-PROCESS S3a

EXTRACTION SUB-PROCESS S3b

GRINDING PROCESS S4

METHOD OF MANUFACTURING THROUGH ELECTRODE-ATTACHED GLASS SUBSTRATE AND METHOD OF MANUFACTURING ELECTRONIC COMPONENT

BACKGROUND OF THE INVENTION

1. Field of the Invention

The present invention relates to a method of manufacturing a glass substrate in which a plurality of through electrodes is formed in the glass substrate and a method of manufacturing an electronic component using the method.

2. Background Art

Recently, piezoelectric vibrators using quartz crystal or the like have been used in time sources or timing sources of cellular phones or mobile information terminal devices. There are many types of piezoelectric vibrator, and, as one of them, a piezoelectric vibrator of a surface mounting type is known. As such a piezoelectric vibrator, a three-layer structure type is known in which a piezoelectric substrate, in which a piezoelectric vibrating piece is formed, is vertically interposed and bonded between a base substrate and a lid substrate. The piezoelectric vibrating piece is housed inside a cavity that is formed between the base substrate and the lid substrate.

In addition, recently, piezoelectric vibrators of a two-layer structure type have been developed. This type is configured by a package of a two-layer structure type in which a base substrate and a lid substrate are directly bonded to each other, and a piezoelectric vibrating piece is housed inside a cavity that is configured between the base substrate and the lid substrate. A piezoelectric device of the two-layer structure type has advantages over a piezoelectric device of the three-layer structure type in that the thickness thereof can be formed thin and the like.

In JP-A-2002-124845 and JP-A-2002-121037, quartz crystal vibrator packages of the two-layer structure type are disclosed. As the package material of the base substrate and the lid substrate, glass is used. Since glass is used, molding can be performed in a relatively easy manner, and the manufacturing cost can be lower than that of a case where ceramics are used. In addition, since glass has a low thermal conductivity coefficient, the thermal insulating properties thereof are superior, whereby a piezoelectric vibrator disposed therein can be protected from changes in temperature.

In JP-A-2003-209198, a method of simultaneously forming a plurality of quartz crystal vibrator packages of the two-layer structure type as described above is disclosed. In this case, a method is disclosed in which glass is used as the material of a base substrate, and through electrodes formed from a metal material are formed in the base substrate. When the through electrodes are formed in the glass, first, through holes are formed in a glass plate. FIGS. 11A and 11B illustrate a method of forming through electrodes formed of metal pins 115 in the glass plate 131 (FIG. 3 in JP-A-2003-209198). FIG. 11A illustrates a method of forming through holes 119 in the glass plate 131. The glass plate 131 is arranged at the bottom of a die 126. In the die 126, a heater 125 is installed and can apply heat to the glass plate 131. On the upper side of the die 126, a punching machine configured by a puncher 129 is installed. On the side of the puncher 129 that is the glass plate 131 side, drilling pins 128 are installed, and a heater 127 is installed in the puncher 129 as well. After the glass plate 131 is heated at a predetermined temperature, the puncher 129 is lowered so as to form the through holes 119.

FIG. 11B illustrates a method of driving metal pins 115 into the through holes 119 of the glass plate 131. The glass plate 131 in which the through holes 119 are formed is installed to a base 135, and glass frit 132 is blown to the through holes 119 by a glass frit blower 133, and the metal pins 115 are driven into the through holes 119 by a metal pin puncher 134.

FIGS. 12A and 12B illustrate a press molding process (FIG. 4 of JP-A-2003-209198). As illustrated in FIG. 12A, the glass plate 131 in which the metal pins 115 are driven into the through holes 119 is installed between a pressing lower die 136 and a pressing upper die 137. In the pressing upper die 137, a partition convex ridge 138, a pinhead housing concave portion 139, and a concave-portion forming convex ridge 141 are formed. This die is input into an electric furnace and is heated at a temperature equal to or higher than 1000° C. while pressing the pressing upper die 137 to the pressing lower die 136. As a result, as illustrated in FIG. 12B, the concavity and convexity of the surface of the pressing upper die 137 is transferred onto the glass plate 131, and a division groove 142 and concave portions 116 are formed in the glass plate 131. Simultaneously, through electrodes that are configured by the metal pins 115 having sealability are formed in the glass plate 131.

SUMMARY OF THE INVENTION

However, when the metal pins 119 are inserted into the through holes 119 formed in the glass plate 131, and the glass plate 131 and the metal pins 119 are heated while being pressed by the pressing upper die 137 so as to be welded and then are cooled, internal stress is generated due to the flow of the glass, the non-uniformity of heat at the time of cooling, and a difference between the thermal expansion coefficients of the glass and the metal pins, whereby the glass plate 131 is distorted in a complex manner. In a case where the bent state is to be corrected through grinding, when the glass plate 131 is thin, such a bent state cannot be eliminated. In addition, the amount of grinding increases, and the object of multiple patterning cannot be attained. Furthermore, in a case where the flatness of the surface of the sidewall surrounding the concave portion 116 is bad, the airtightness of a lid bonded to the surface cannot be acquired, and there is a problem in that the reliability of the electronic component is lowered.

The present invention is contrived in consideration of the above-described problems, and the object of the invention is to provide a through electrode-attached glass substrate having superior flatness.

According to an embodiment of the invention, there is provided a method of manufacturing a through electrode-attached glass substrate. The method includes: forming an effective unit cell by drilling a plurality of through holes in a unit cell with a minimum area acquired by cutting out and dividing plate-shaped glass being configured as the unit cell and distributing dummy unit cells in which the through hole is not formed in an area in which the effective unit cell is formed; inserting electrode members into the through holes; welding the plate-shaped glass and the electrode members by heating the plate-shaped glass at a temperature that is higher than a softening point of the plate-shaped glass; and grinding both sides of the plate-shaped glass together with the electrode members so as to expose a plurality of the electrode members to the both sides of the plate-shaped glass and configure the plurality of the electrode members as a plurality of through electrodes that are electrically separated from each other.

In addition, in the forming of an effective unit cell and distributing of dummy unit cells, the ratio of the dummy unit cell to the effective unit cell may be in the range of 4 to 1 to 20 to 1.

In addition, in the above-described methods, in the forming of an effective unit cell and distributing of dummy unit cells, the ratio of the dummy unit cell to the effective unit cell in an edge portion of the plate-shaped glass may be higher than that in a center portion of the plate-shaped glass.

In addition, in the inserting of electrode members, pins of the electrode members in which the pins are arranged so as to be erected on bases may be inserted into the through holes of the effective unit cell.

In addition, in the welding of the plate-shaped glass and the electrode members, the glass substrate in which the pins are inserted may be interposed and pressed between a receiving die and a pressurizing die.

In addition, the forming of an effective unit cell and distributing of dummy unit cells may include: arranging a plurality of convex portions in either a receiving die or a pressurizing die that are formed from carbon materials, heating the glass substrate being interposed between the receiving die and the pressurizing die, and forming a plurality of concave portions on one surface of the glass substrate; and allowing the plurality of concave portions to pass through from the one surface to the other surface by grinding the other surface located on a side opposite to the one surface of the glass substrate.

In addition, cooling the glass substrate and the electrode members may be further included after the welding of the plate-shaped glass and the electrode members, wherein, in the cooling of the glass substrate and the electrode members, a cooling rate for a range from temperatures higher than a strain point of the glass substrate by 50° C. to temperatures lower than the strain point by 50° C. is configured to be slower than a cooling rate for a range up to a temperature higher than the strain point by 50° C.

According to another embodiment of the invention, there is provided a method of manufacturing an electronic component, including: forming a glass substrate using any of the above-described methods; forming electrodes in the glass substrate so as to be configured as a base substrate; mounting an electronic component on the base substrate; and bonding a lid substrate to the base substrate on which the electronic component is mounted.

A method of manufacturing a through electrode-attached glass substrate according to an embodiment of the invention includes: forming an effective unit cell by drilling a plurality of through holes in a unit cell with a minimum area acquired by cutting out and dividing plate-shaped glass being configured as the unit cell and distributing dummy unit cells in which the through hole is not formed in an area in which the effective unit cell is formed; inserting electrode members into the through holes; welding the plate-shaped glass and the electrode members by heating the plate-shaped glass at a temperature that is higher than a softening point thereof; and grinding both sides of the plate-shaped glass together with the electrode members so as to expose a plurality of the electrode members to the both sides of the plate-shaped glass and configure the plurality of the electrode members as a plurality of through electrodes that are electrically separated from each other. Accordingly, the flow of the glass is reduced, and, by decreasing the volume ratio of the electrode material in the glass, the residual internal stress decreases, whereby a through electrode-attached glass substrate having superior flatness and high airtightness can be formed.

DETAILED DESCRIPTION OF THE INVENTION

Figure 1:
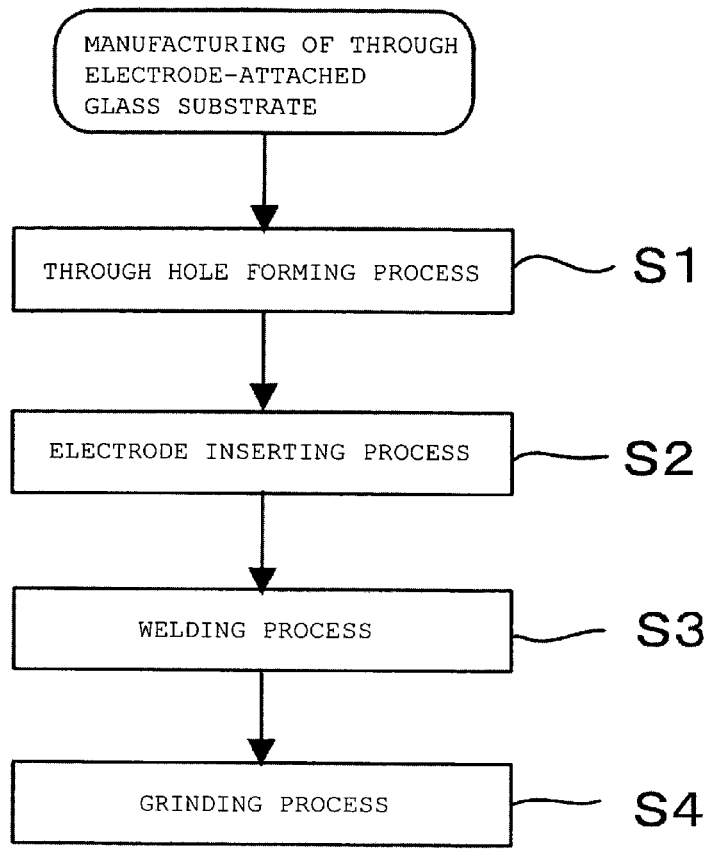
FIG. 1 is a process diagram illustrating a method of manufacturing a glass substrate according to an embodiment of the present invention.
Figure 2:
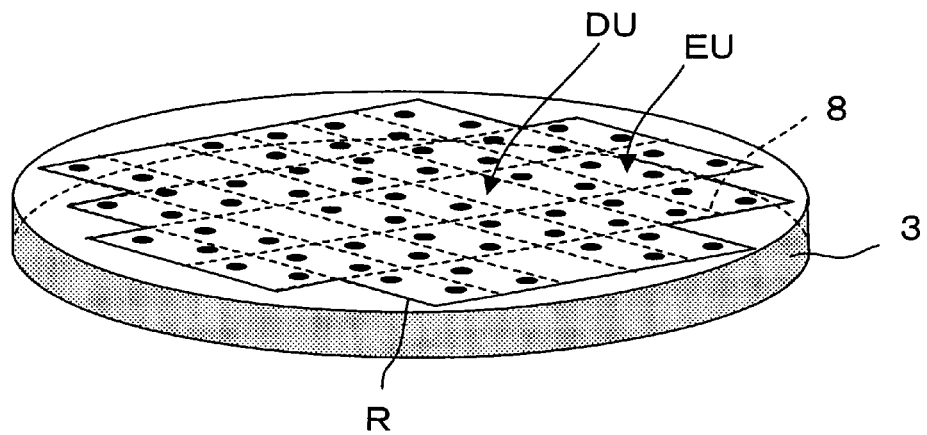
FIG. 2 is a perspective view of a through electrode-attached glass substrate manufactured by using a method of manufacturing a glass substrate according to an embodiment of the invention.

FIG. 1 is a process diagram illustrating a method of manufacturing a through electrode-attached glass substrate according to an embodiment of the present invention and illustrates a basic configuration according to an embodiment of the invention. FIG. 2 is a schematic perspective view of the through electrode-attached glass substrate 3. A through electrode-attached glass substrate according to an embodiment of the invention is used for concurrently packaging a plurality of electronic components. First, in a through hole forming process S1, a minimum area acquired by cutting out and dividing a plate-shaped glass is configured as a unit cell, an effective unit cell is formed by drilling a plurality of through holes in the unit cell, and dummy unit cells in which the through hole is not formed in an area, in which the effective unit cell is formed, are distributed. In the through hole forming process S1, through holes can be formed in plate-shaped glass by sandblast, drill grinding, or shape molding and grinding. In a case where the through holes are formed by the shape molding and grinding, through holes can be formed through a concave portion forming process in which a plurality of convex portions is arranged in either a receiving die or a pressurizing die, plate-shaped glass is interposed between the receiving die and the pressurizing die and heated, and a plurality of concave portions is formed on one surface of the plate-shaped glass, and a pass-through process in which the plurality of concave portions passes through from one surface to the other surface by grinding the other surface located on the side opposite to the one surface of the plate-shaped glass on which the concave portions are formed.

Next, in an electrode inserting process S2, an electrode member is inserted into the through hole of the effective unit cell. Next, in a welding process S3, the plate-shaped glass is heated at a temperature higher than the softening point thereof, whereby the plate-shaped glass and the electrode members are welded. Next, in a grinding process S4, both sides of the plate-shaped glass are ground together with the electrode members, thereby exposing the plurality of the electrode members to both sides of the plate-shaped glass so as to be formed as a plurality of through electrodes electrically separated from each other. FIG. 2 is a perspective view of a glass substrate 3 manufactured as described above, and the dummy unit cells DU are distributed in areas R in which the effective unit cells EU are formed. As a result, the flow amount of the glass is reduced, and the occupied volume ratio of the electrode members in the glass material is decreased. Accordingly, the residual stress inside the glass decreases, whereby the flatness of the glass substrate 3 is improved. In addition, in the electrode inserting process S2, the pins of the electrode members, in which the pins are arranged so as to stand erect on the pedestal thereof, are inserted into the through holes. Then, in a welding process S3, the plate-shaped glass, into which the corresponding pins are inserted, is interposed between the receiving die and the pressurizing die and can be heated while being pressed. Accordingly, the glass and the pins can be reliably welded in a short time.

In addition, the ratio of the dummy unit cell to the effective unit cell can be configured in the range of 4 to 1 to 20 to 1. When the ratio is higher than 4 to 1, the number of patterns obtained in multiple patterning decreases so as to decrease the productivity. On the other hand, when the ratio is lower than 20 to 1, the effect of improving the flatness of the glass substrate by configuring the dummy unit cells is reduced. In addition, the ratio of the dummy unit cell to the effective unit cell is configured to increase from the center portion of the plate-shaped glass toward the periphery portion thereof. Accordingly, the volume ratio of the electrode material with respect to the plate-shaped glass gradually changes between an area, in which the effective unit cell is not formed, of the outer periphery portion and an area in which the effective unit cell is formed. In accordance with the change in the volume ratio, the residual internal stress gradually changes, whereby the degree of the bent state of the glass substrate is lowered.

Here, as the plate-shaped glass, soda-lime glass, borosilicate glass, lead glass, or the like may be used. In addition, as the material of the electrode member, a Ni—Fe alloy, for example, a "42 alloy" or kovar may be used. By using such an alloy, the thermal expansion coefficient can be approximated to that of the glass, and accordingly, the degree of the bent state of the glass substrate is lowered, whereby the deterioration of the boundary between the glass and the through electrode due to a thermal change can be prevented.

In addition, in a cooling process in which the plate-shaped glass is cooled after the welding process S3, the cooling rate for the range of temperatures higher than the strain point of the glass substrate by 50° C. to temperatures lower than the strain point by 50° C. can be configured to be slower than that for the range up to a temperature higher than the strain point by 50° C. In such a case, the distortion remaining on the glass substrate is reduced, and accordingly, a gap or a crack between a wire and the glass substrate is prevented, whereby the through electrode having high airtightness can be formed. Hereinafter, embodiments of the present invention will be described with reference to the drawings.

First Embodiment

Figure 3A:
FIGS. 3A to 3H are diagrams illustrating a method of manufacturing a glass substrate according to an embodiment of the invention.
Figure 3B:
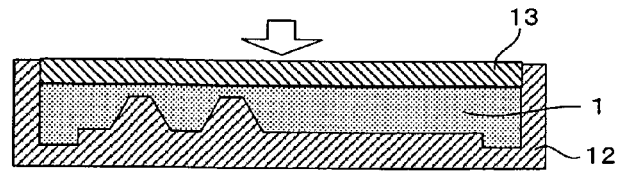

FIGS. 3A to 3H are diagrams illustrating a method of manufacturing a glass substrate according to a first embodiment of the invention. Hereinafter, the description will be followed with reference to the drawings. First, a through hole forming process S1 will be described. The through hole forming process S1 includes a glass preparing sub-process S1a, a concave portion forming sub-process S1b, and a pass-through sub-process S1c. In the glass preparing sub-process S1a, as illustrated in FIG. 3A, plate-shaped glass 1 is prepared. As the plate-shaped glass 1, soda-lime glass is used. Next, in the concave portion forming sub-process S1b, as illustrated in FIG. 3B, the plate-shaped glass 1 is interposed between a receiving die 12 having a surface on which convex portions are formed and a pressurizing die 13 having a flat surface, and the plate-shaped glass 1 is heated at a temperature equal to or higher than the softening point while being pressed by the pressurizing die 13. As the material of the receiving die 12 and the pressurizing die 13, a carbon material that has superior mold releasability for glass is used.

Figure 3C:
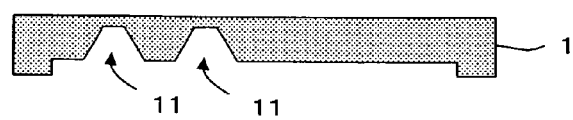
Figure 3D:
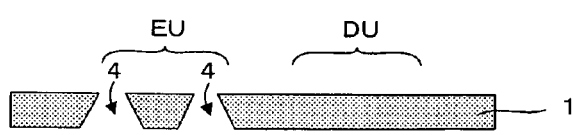

FIG. 3C illustrates a state in which the plate-shaped glass 1 is cooled and is taken out from the dies. On one surface of the plate-shaped glass 1, a plurality of concave portions 11 transferred from the convex portions of the receiving die 12 is formed. Next, in the pass-through sub-process S1c, as illustrated in FIG. 3D, a surface that is opposite to the one surface of the plate-shaped glass 1 is ground, so that the plurality of concave portions 11 passes through from the one surface to the other surface. Accordingly, the effective unit cell EU configured by two through holes 4 and the dummy unit cell DU in which the through hole is not formed are formed. Each through hole 4 has a trapezoidal shape of which a cross-section is a circular truncated cone so as to have good mold releasability. In addition, the layout of the dummy unit cells DU will be described in detail in second to fourth embodiments.

Figure 3E:
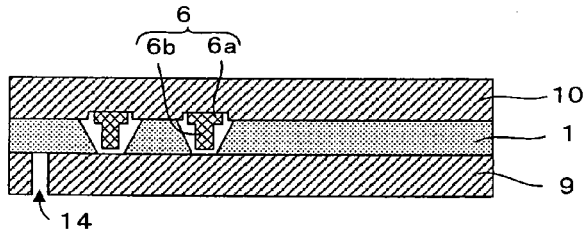
Figure 3F:
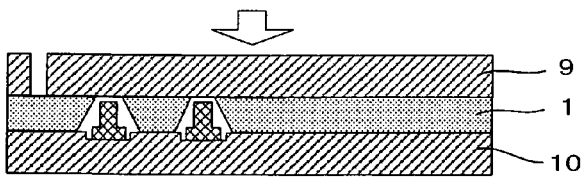

Next, in the electrode inserting process S2, as illustrated in FIG. 3E, a pin 6b of an electrode member 6 acquired by arranging the pin 6b so as to stand erect on abase 6a is installed to a through hole 4, and the electrode member is installed between the pressurizing die 9 and the receiving die 10. It is preferable that the material of the electrode member 6 has a thermal expansion coefficient that is close to that of the plate-shaped glass 1. In this embodiment, a "42 alloy" as a Fe—Ni alloy is used. In the pressurizing die 9, a slit 14 that is used for extracting remaining air bubbles to the outside is arranged. The receiving die 10 has concave portions used for receiving the bases 6a. Next, in a heating and pressurizing sub-process S3a of the welding process S3, as illustrated in FIG. 3F, the pressurizing die 9 and the receiving die 10 are vertically reversed, and the plate-shaped glass 1 is heated at a temperature (for example, 900° C.) equal to or higher than the softening point of the plate-shaped glass 1 while pressing the pressurizing die 9 (for example, 30 g to 50 g/cm$^2$). Then, the glass material is softened so as to flow, and the side face of the pin 6b and the inner wall face of the through hole 4 are welded.

Figure 3G:

Next, in an extraction sub-process S3b after the welding process S3, the plate-shaped glass 1 is cooled, and, as illustrated in FIG. 3G, the plate-shaped glass 1 is taken out from the dies. In the dummy unit cell DU, there is no electrode member 6 that is a source of generation of the residual stress, and the flow of the glass is small, and accordingly, the dummy unit cell DU serves to decrease the degree of the bent state or the distortion of the plate-shaped glass 1. In addition, the cooling of the plate-shaped glass 1 can be configured such that the cooling rate for the range from temperatures higher than the strain point of the plate-shaped glass 1 by 50° C. to temperatures lower than the strain point by 50° C. is slower than that for the range up to a temperature higher than the strain point by 50° C. Accordingly, the residual distortion of the plate-shaped glass 1 is reduced, whereby the occurrence of a gap or a crack on the boundary face of the pin 6b and the plate-shaped glass 1 due to a difference in the thermal expansion can be prevented.

Figure 3H:
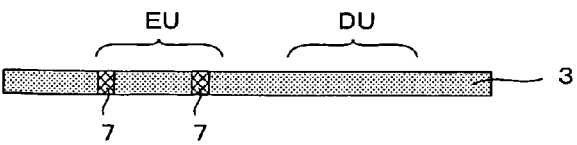

Next, in the grinding process S4, as illustrated in FIG. 3H, both sides of the plate-shaped glass 1 are ground and polished together with the electrode members 6, so that a glass substrate 3, to which a through electrode 7 is attached, is formed in which each electrode member 6 is exposed to both sides thereof. By distributing the dummy unit cells DU in the area of the effective unit cell EU in which the through electrode 7 is formed, the internal stress is alleviated, whereby a through electrode-attached glass substrate having superior flatness and high airtightness can be formed.

Second Embodiment

Figure 4:
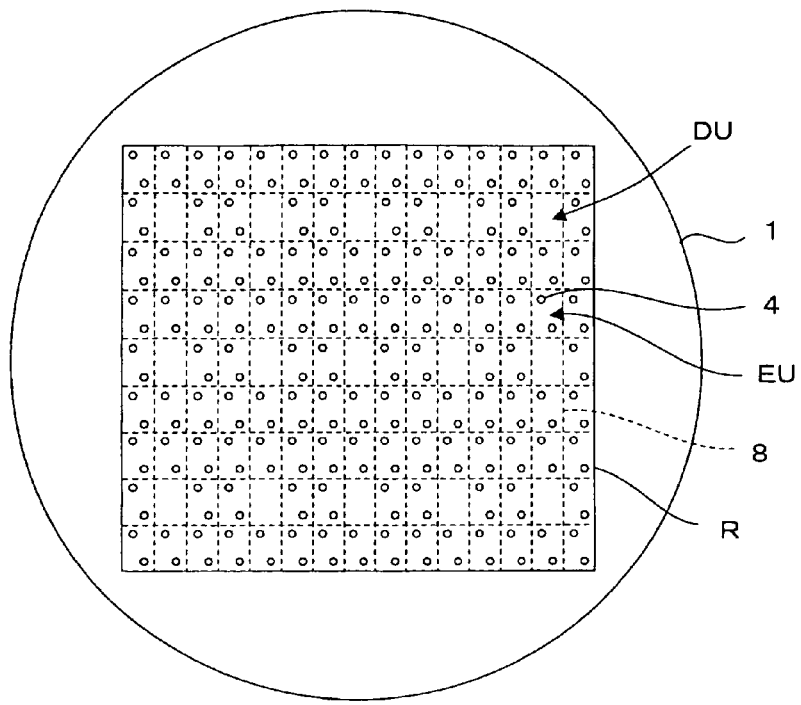
FIG. 4 is a diagram illustrating a method of manufacturing a glass substrate according to an embodiment of the invention and illustrates a layout of effective unit cells and dummy unit cells.

FIG. 4 illustrates a method of manufacturing a through electrode-attached glass substrate according to the second embodiment of the invention and shows a layout of the effective unit cell EU and the dummy unit cell DU that are formed in the through hole forming process S1. The process of manufacturing the glass substrate 3 is the same as that according to the first embodiment, and thus the description thereof is omitted.

As illustrated in FIG. 4, a plurality of effective unit cells EU divided by cutout lines 8 and the dummy unit cells DU distributed in areas R in which the effective unit cells EU are formed are arranged on the surface of a plate-shaped glass 1. The cutout lines 8 are lines that are used for cutting out and dividing a wafer of a glass substrate 3 into the plurality of unit cells U. In each effective unit cell EU, a plurality of the through holes 4 is formed.

Here, in the area R in which the effective unit cell EU is formed, the ratio of the dummy unit cell DU to the effective unit cell EU is configured as 8 to 1. In other words, within an area partitioned by nine unit cells U, the effective unit cells EU each having two through holes 4 and the dummy unit cell DU having no through hole 4 are installed at the ratio of 8 to 1. Accordingly, the flow of the glass decreases, and the volume ratio of the electrode member in the glass decreases, whereby the residual internal stress is reduced. As a result, a through electrode-attached glass substrate having superior flatness and high airtightness can be formed. In addition, the ratio of the dummy unit cell to the effective unit cell may be configured in the range of 4 to 1 to 20 to 1. When the ratio is higher than 4 to 1, the number of patterns obtained in multiple patterning decreases so as to decrease the productivity. On the other hand, when the ratio is lower than 20 to 1, the effect of improving the flatness is reduced.

Third Embodiment

Figure 5:
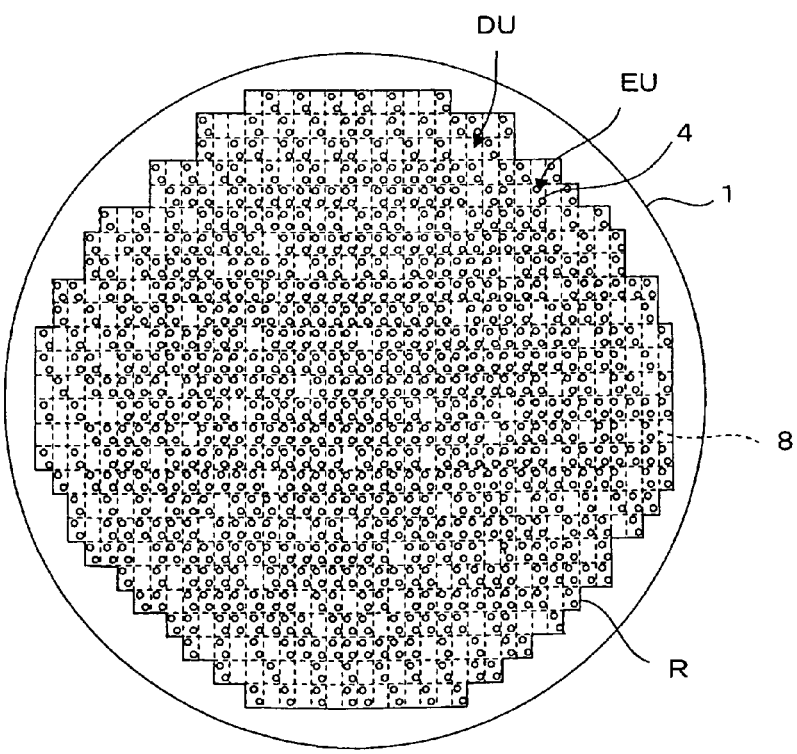
FIG. 5 is a diagram illustrating a method of manufacturing a glass substrate according to an embodiment of the invention and illustrates a layout of effective unit cells and dummy unit cells.

FIG. 5 illustrates a method of manufacturing a through electrode-attached glass substrate according to the third embodiment of the invention and shows another layout of the effective unit cells EU and the dummy unit cells DU that are formed in the through hole forming process S1. A difference between the second and third embodiments is that, instead of uniformly distributing the dummy unit cells DU in the areas in which the effective unit cells EU are formed, a specific distribution thereof is formed in the third embodiment. The process of manufacturing a glass substrate 3 is the same as that according to the first embodiment, and thus the description thereof is omitted.

As illustrated in FIG. 5, in the area R in which the effective unit cell EU of the plate-shaped glass 1 is formed, the ratio of the dummy unit cell DU to the effective unit cell EU in the edge portion of the plate-shaped glass 1 is higher than that in the center portion thereof. Accordingly, the volume ratio of the electrode member 6 to the plate-shaped glass 1 gradually changes between an area, in which the effective unit cell EU is not formed, of the outer periphery portion and an area in which the effective unit cell EU is formed. Therefore, the residual internal stress gradually changes, whereby the degree of the bent state of the glass substrate 3 can be lowered.

Fourth Embodiment

Figure 6:
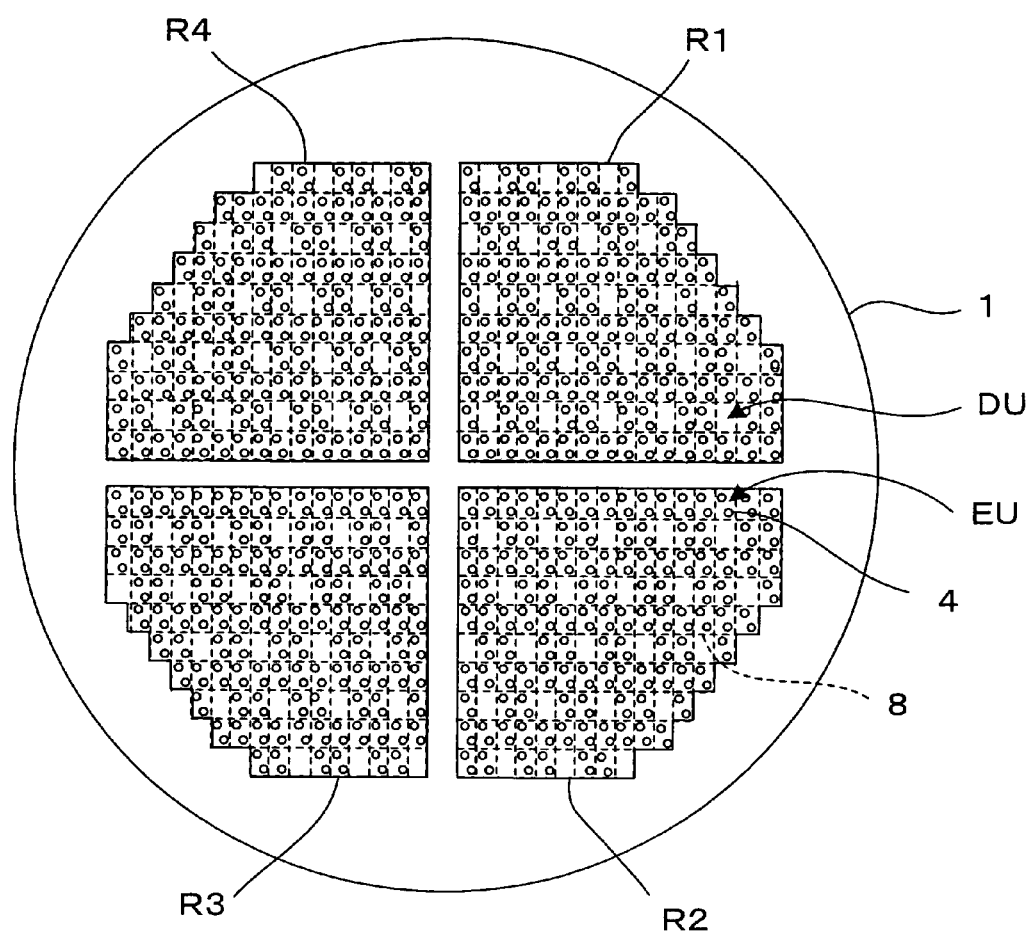
FIG. 6 is a diagram illustrating a method of manufacturing a glass substrate according to an embodiment of the invention and illustrates a layout of effective unit cells and dummy unit cells.

FIG. 6 illustrates a method of manufacturing a through electrode-attached glass substrate according to the fourth embodiment of the invention and shows a further layout of the effective unit cells EU and the dummy unit cell DU that are formed in the through hole forming process S1. A difference between the second and third embodiments and the fourth embodiment is that the area, in which the effective unit cell EU is formed, is divided into four portions, and a cross-shaped area that does not configure the unit cells U or dummy unit cells DU that are continuous in a cross shape are formed in the center portion of the plate-shaped glass 1 in the fourth embodiment. The process of manufacturing a glass substrate 3 is the same as that according to the first embodiment, and thus the description thereof is omitted.

As illustrated in FIG. 6, a cross-shaped area, in which the unit cell U is not formed, is arranged in the periphery portion and the center portion of the plate-shaped glass 1, and the effective unit cells EU are arranged so as to be divided into four areas R1, R2, R3, and R4. In each of the areas R1, R2, R3, and R4, the ratio of the dummy unit cell DU to the effective unit cell EU is configured as approximately 6 to 1, and the dummy unit cells DU are almost uniformly distributed. By arranging a cross-shaped area in which the effective unit cell EU is not formed from the center of the plate-shaped glass 1 to the outer periphery thereof, in other words, by arranging a continuous area in which the electrode member 6 is not buried in the plate-shaped glass 1, the degree of the bent state of the plate-shaped glass 1 can be lowered. In addition, the ratio of the dummy unit cell DU to the effective unit cell EU is configured as approximately 6 to 1 in the areas R1, R2, R3, and R4, the occupied volume ratio of the electrode member 6 in the glass material is decreased, whereby the degree of the bent state of the glass substrate 3 is lowered.

As above, in the second to fourth embodiments, the external dimension of the glass substrate 3 is in the range of 1 inch to 4 inches, the thickness thereof is in the range of 0.2 to 0.6 mm, the size of the unit cell is in the range of 1 mm to 3 mm, and the diameter of the through electrode 7 is in the range of 0.05 mm to 1 mm. In addition, although examples have been illustrated in which two through electrodes 7 are installed in an effective unit cell EU, it is apparent that three or more through electrodes 7 may be formed.

Fifth Embodiment

Figure 7:
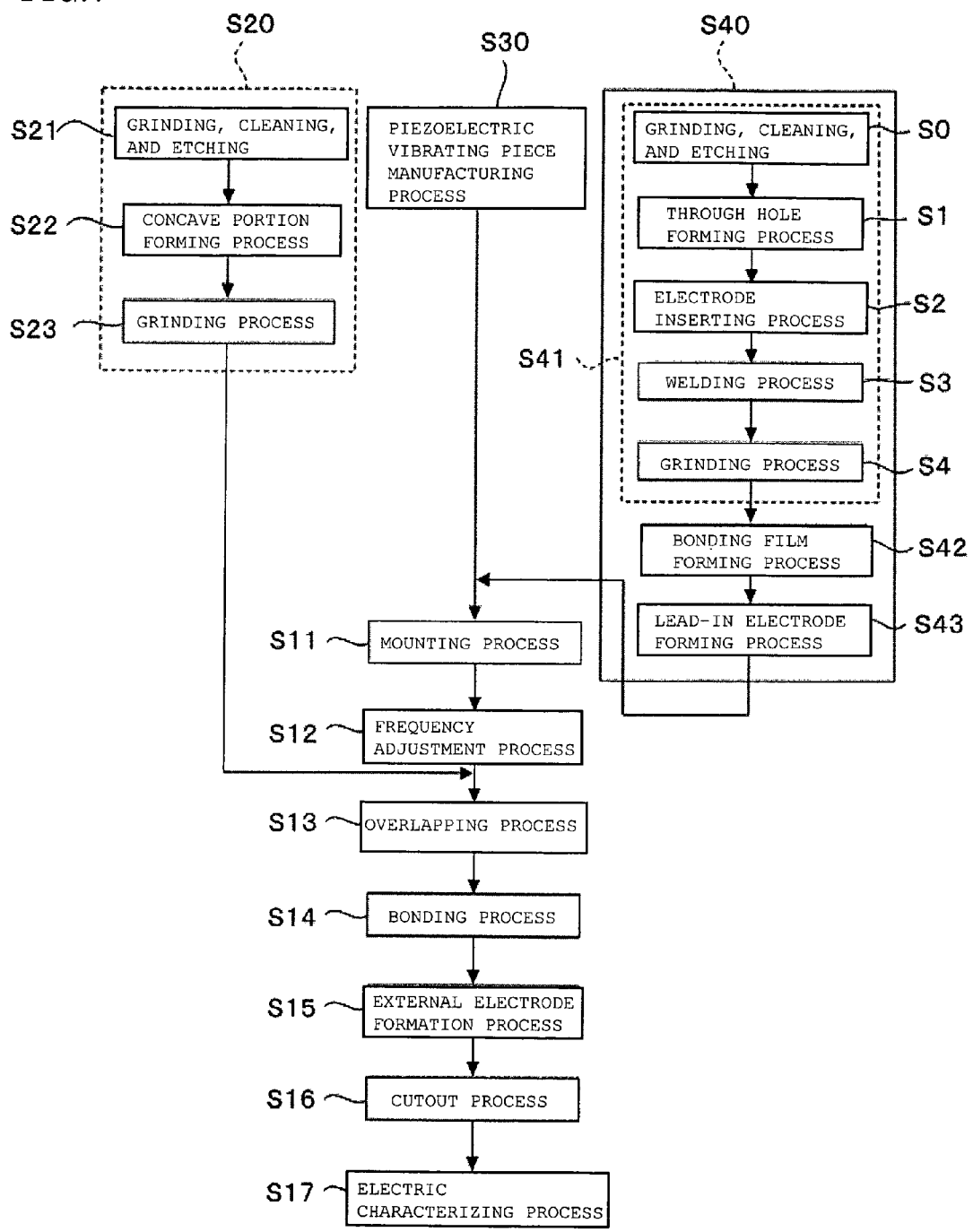
FIG. 7 is a process diagram illustrating a method of manufacturing an electronic component according to an embodiment of the invention.
Figure 8:
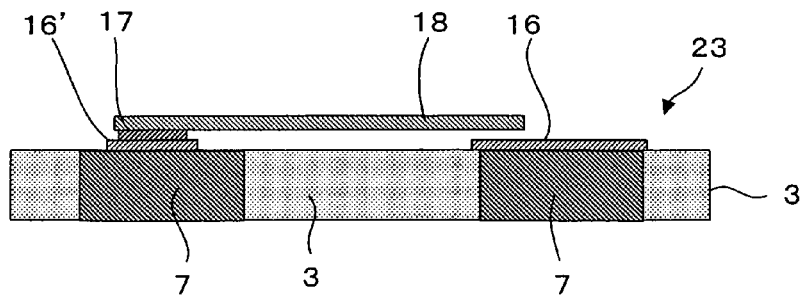
FIG. 8 illustrates a method of manufacturing an electronic component according to an embodiment of the invention and is a schematic cross-sectional view illustrating a state in which a piezoelectric vibrating piece is mounted on a glass substrate.
Figure 9:
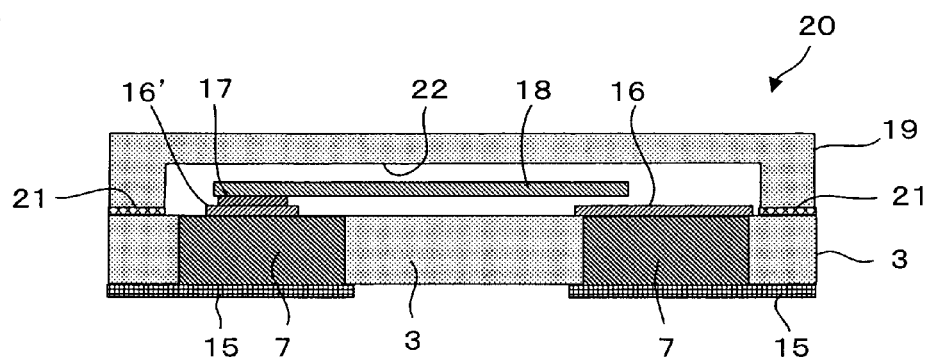
FIG. 9 illustrates a method of manufacturing an electronic component according to an embodiment of the invention and is a schematic cross-sectional view of a piezoelectric vibrator.

FIG. 7 is a process diagram illustrating a method of manufacturing an electronic component according to the fifth embodiment of the invention. An example is illustrated therein in which a piezoelectric vibrator is used as an electronic component that is mounted on the glass substrate. FIG. 8 is a schematic cross-sectional view illustrating a state in which a piezoelectric vibrating piece 18 is mounted on a glass substrate 3 in which through electrodes 7 are formed, and FIG. 9 is a schematic cross-sectional view of a completed piezoelectric vibrator 20. According to this fifth embodiment, a base substrate forming process S40, a lid substrate forming process S20, and a piezoelectric vibrating piece generating process S30 are included. Hereinafter, these will be sequentially described as below.

First, in a polishing, cleaning, and etching process S0, plate-shaped glass 1 is prepared, and a polishing process, a cleaning process, an etching process, and the like are performed. In addition, in order to form a through electrode 7, for example, an electrode member 6 is prepared in which a pin 6b is arranged so as to stand erect on a base 6a. In the through hole forming process S1, a minimum area acquired by cutting out and dividing the plate-shaped glass 1 is configured as a unit cell, a plurality of the through holes is drilled in the unit cell so as to form an effective unit cell EU, and the dummy unit cells DU in which the through hole is not formed are distributed in the area in which the effective unit cell EU is formed. In this case, the plate-shaped glass 1 is heated at a temperature that is equal to or higher than the softening point thereof, the plate-shaped glass 1 is pressed by a die in which a plurality of convex portions is formed so as to concurrently form a plurality of concave portions on the surface of the plate-shaped glass 1. Then, a plurality of through holes 4 can be formed by grinding the plate-shaped glass 1.

Next, in the electrode inserting process S2, electrode members 6 are inserted into the through holes 4. Next, in the welding process S3, the plate-shaped glass 1 is heated at a temperature higher than the softening point thereof, whereby the plate-shaped glass 1 and the electrode members 6 are welded. Then, the plate-shaped glass 1 to which the electrode members 6 are installed is interposed between the receiving die 10 and the pressurizing die 9, and the plate-shaped glass 1 is welded while pressing the pressurizing die 9. Accordingly, the flow of the glass is promoted, whereby the welding time can be shortened. Next, the plate-shaped glass 1 is cooled and is taken out from the dies. Next, in the grinding process S4, both sides of the plate-shaped glass 1 are ground so as to expose a plurality of the electrode members 6 to the surface thereof. As above, a glass substrate 3, in which the plurality of the through electrodes 7 being electrically separated from each other is formed, having good flatness is acquired. A glass substrate forming process S41 is as described above.

Next, in a bonding film forming process S42, a bonding film that is used for anode bonding is deposited on the outer periphery area of each unit cell U of the glass substrate 3. As the bonding film, an aluminum film is deposited. Next, in a lead-in electrode forming process S43, lead-in electrode 16 is formed from the surface of one through electrode 7 along the outer periphery portion of the glass substrate 3 so as to be configured as a base substrate 23. The lead-in electrodes 16 and 16' are formed by depositing an Au/Cr film using a sputtering method and patterning the film through a photolithographic process and an etching process. Instead of the sputtering method, the lead-in electrodes 16 and 16' may be formed by using a printing method or the like. The base substrate forming process S40 has been described as above.

Next, the lid substrate forming process S20 will be described. It is preferable that the material of the lid substrate 19 is the same as that of the base substrate 23 so as to decrease a difference in the thermal expansion when the lid substrate 19 is bonded to the base substrate 23. In a case where soda-lime glass is used as the material of the base substrate 23, soda-lime glass that is the same as the material of the base substrate 23 is used as the material of the lid substrate 19. First, in a grinding, cleaning, and etching process S21, the glass substrate is ground, an etching process is performed for the glass substrate so as to remove an affected layer located on the uppermost surface, and the glass substrate is cleaned.

Next, in a concave portion forming process S22, a concave portion 22 is formed through die molding. The concave portion is molded by interposing a glass substrate between a receiving die having a convex portion and a pressurizing die having a concave portion and heating the glass substrate at a temperature equal to or higher than the softening point of the glass and pressing the glass substrate. The molding die is preferably formed of a carbon material. The reason for this is that the carbon material has superior mold releasability for glass and superior absorbency of air bubbles. Next, in a grinding process S23, a bonding face to be bonded to the base substrate 23 is ground so as to be a flat face. Accordingly, the sealability at a time when the glass substrate is bonded to the base substrate 23 can be improved.

Next, in a piezoelectric vibrating piece manufacturing process S30, a piezoelectric vibrating piece 18 that is configured by a quartz crystal substrate is prepared. On both surfaces of the piezoelectric vibrating piece 18, excitation electrodes, which are not shown in the figure, being electrically separated from each other are formed and are electrically connected to terminal electrodes formed on the surface of one end of the piezoelectric vibrating piece 18. Next, in a mounting process S11, a conductive adhesive 17, for example, a gold bump is formed in end portions of the through electrode 7 and the lead-in electrode 16' of the base substrate 23 or the terminal electrode of the piezoelectric vibrating piece 18. The piezoelectric vibrating piece 18 is mounted using the conductive adhesive 17 in a cantilever shape supported on one side. Accordingly, the excitation electrodes formed on both sides of the piezoelectric vibrating piece 18 are electrically separated from each other and are conductive with two through electrodes 7.

Next, in a frequency adjusting process S12, the vibration frequency of the piezoelectric vibrating piece 18 is adjusted to a predetermined frequency. Next, in an overlapping process S13, the lid substrate 19 is installed on the base substrate 23 and overlaps each other through a bonding material 21. Next, in a bonding process S14, the base substrate 23 and the lid substrate 19 overlapping each other are heated, and a high voltage is applied between the base substrate 23 and the lid substrate 19 for anode bonding. Next, in an external electrode forming process S15, external electrodes 15 electrically connected to the through electrodes 7 are formed on the outer face of the base substrate 23. Next, in a cutout process S16, individual piezoelectric vibrators 20 are acquired by separating and cutting them out along the cutout line 8.

As above, the dummy unit cells DU are distributed in the area, in which the effective unit cell EU is formed, of the plate-shaped glass 1, and accordingly, a flat glass substrate 3, to which through electrodes 7 are attached, having superior airtightness can be manufactured. Therefore, a piezoelectric vibrator 20 having high reliability can be provided. In addition, in the above-described embodiment, the external electrodes 15 formed in the external electrode forming process S15 may be formed in advance in the glass substrate forming process S40. Furthermore, the frequency adjusting process S12 may be performed after the cutout process S16.

Figure 10:
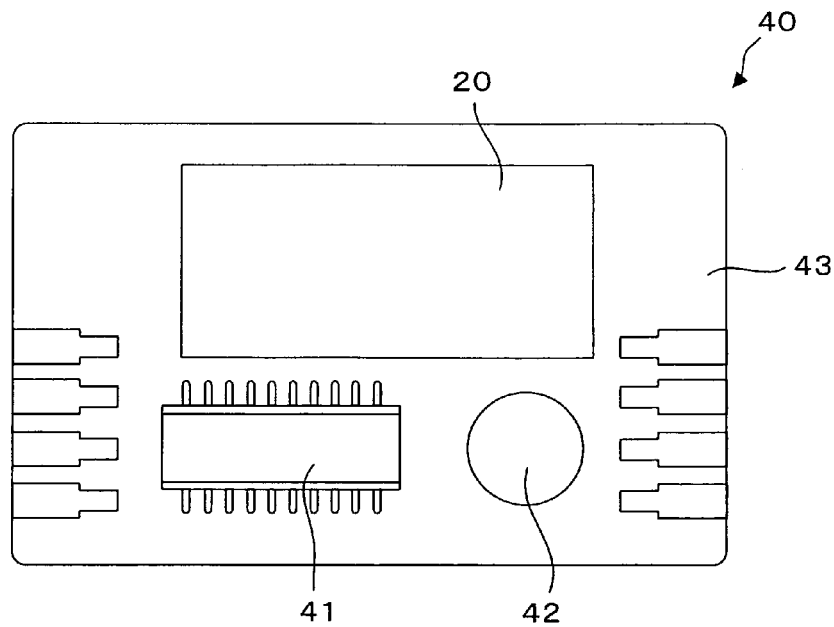
FIG. 10 is a schematic diagram illustrating the surface of an oscillator in which a piezoelectric vibrator manufactured by using a method of manufacturing an electronic component according to an embodiment of the invention is built.
Figure 11A:
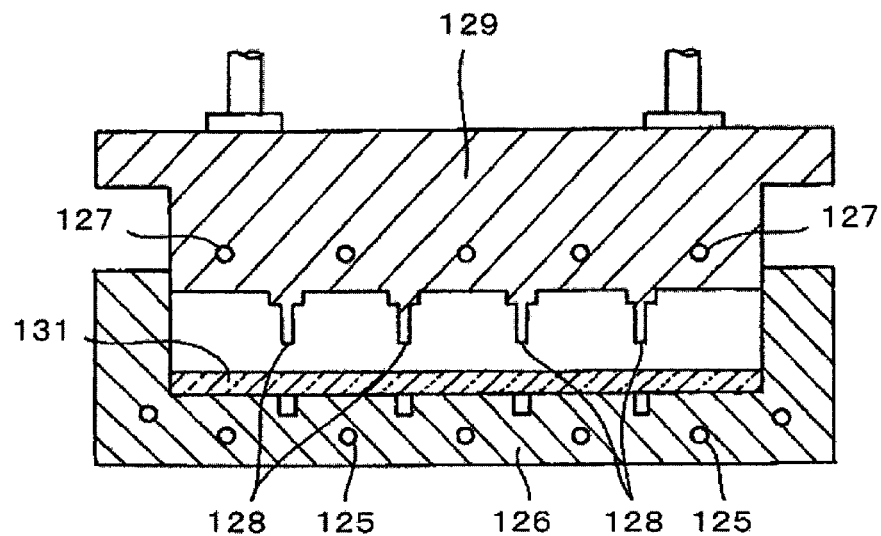
FIGS. 11A and 11B illustrate a conventional known method in which through holes are formed in a glass plate and pins are driven therein.
Figure 11B:
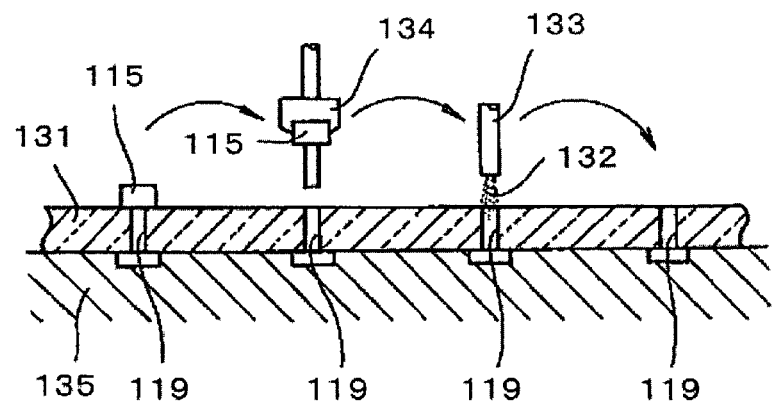
Figure 12A:
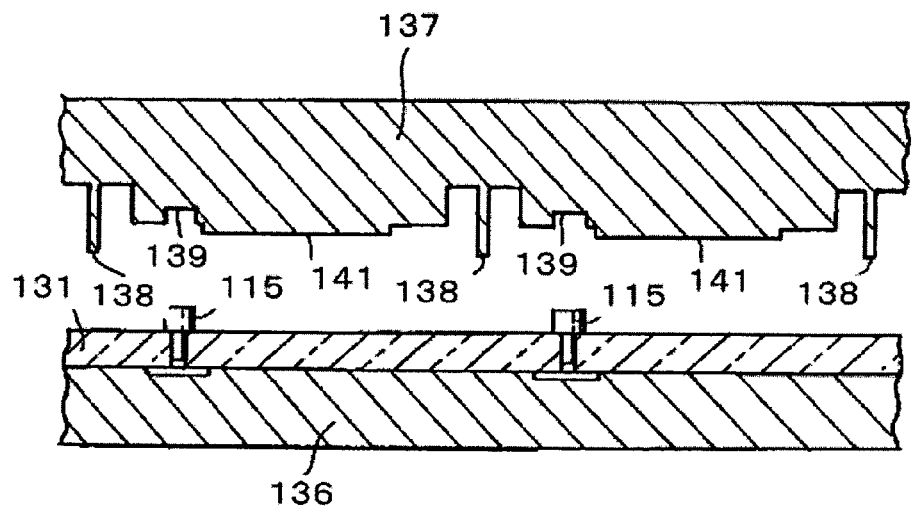
FIGS. 12A and 12B illustrate a state in which a glass plate is molded by using a conventional known press molding method.
Figure 12B:
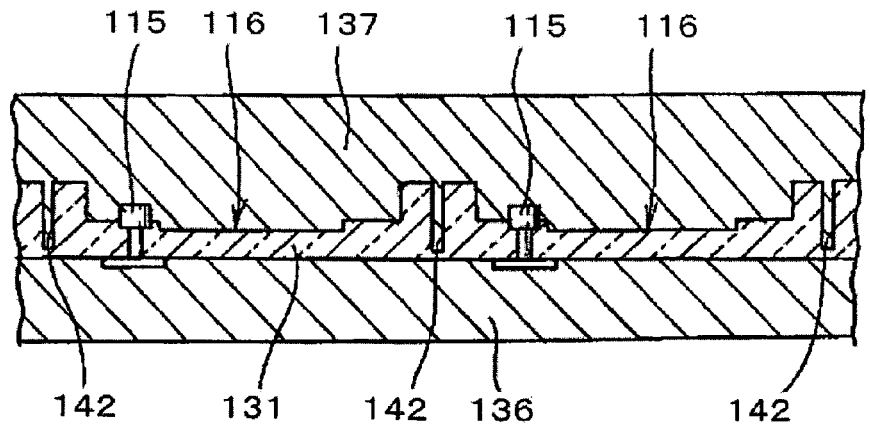

FIG. 10 is a schematic diagram illustrating the surface of an oscillator 40 in which a piezoelectric vibrator 20 manufactured by using a manufacturing method according to the fifth embodiment is built. As illustrated in FIG. 10, the oscillator 40 includes a substrate 43, a piezoelectric vibrator 20 installed on this substrate, an integrated circuit 41, and an electronic component 42. The piezoelectric vibrator 20 generates a signal of a constant frequency based on driving signals supplied to the external electrodes 6 and 7, and the integrated circuit 41 and the electronic component 42 generate a reference signal such as a clock signal by processing signals of the constant frequency that are supplied from the piezoelectric vibrator 20. Since the piezoelectric vibrator 20 according to an embodiment of the invention can be formed to have high reliability in a small size, the entire oscillator 40 can be configured in a compact manner.

What is claimed is:

1. A method of manufacturing a through electrode-attached glass substrate, the method comprising:
   forming an effective unit cell by drilling a plurality of through holes in a unit cell with a minimum area acquired by cutting out and dividing plate-shaped glass being configured as the unit cell and distributing dummy unit cells in which the through hole is not formed in an area in which the effective unit cell is formed;
   inserting electrode members into the through holes;
   welding the plate-shaped glass and the electrode members by heating the plate-shaped glass at a temperature that is higher than a softening point of the plate-shaped glass; and
   grinding both sides of the plate-shaped glass together with the electrode members so as to expose a plurality of the electrode members to the both sides of the plate-shaped glass and configure the plurality of the electrode members as a plurality of through electrodes that are electrically separated from each other.

2. The method according to claim 1, wherein, in the forming of an effective unit cell and distributing of dummy unit cells, the ratio of the dummy unit cell to the effective unit cell is in the range of 4 to 1 to 20 to 1.

3. The method according to claim 1, wherein, in the forming of an effective unit cell and distributing of dummy unit cells, the ratio of the dummy unit cell to the effective unit cell in an edge portion of the plate-shaped glass is higher than that in a center portion of the plate-shaped glass.

4. The method according to claim 1, wherein, in the inserting of electrode members, pins of the electrode members in which the pins are arranged so as to be erected on bases are inserted into the through holes of the effective unit cell.

5. The method according to claim 4, wherein, in the welding of the plate-shaped glass and the electrode members, the glass substrate in which the pins are inserted is interposed and pressed between a receiving die and a pressurizing die.

6. The method according to claim 1,
   wherein the forming of an effective unit cell and distributing of dummy unit cells comprises:
   arranging a plurality of convex portions in either a receiving die or a pressurizing die that are formed from carbon materials, heating the glass substrate being interposed between the receiving die and the pressurizing die, and forming a plurality of concave portions on one surface of the glass substrate; and
   allowing the plurality of concave portions to pass through from the one surface to the other surface by grinding the other surface located on a side opposite to the one surface of the glass substrate.

7. The method according to claim 1, further comprising:
   cooling the glass substrate and the electrode members after the welding of the plate-shaped glass and the electrode members,
   wherein, in the cooling of the glass substrate and the electrode members, a cooling rate for a range from temperatures higher than a strain point of the glass substrate by 50° C. to temperatures lower than the strain point by 50° C. is configured to be slower than a cooling rate for a range up to a temperature higher than the strain point by 50° C.

8. A method of manufacturing an electronic component, the method comprising:
   forming a glass substrate using the method according to claim 1;
   forming electrodes in the glass substrate so as to be configured as a base substrate;
   mounting an electronic component on the base substrate; and
   bonding a lid substrate to the base substrate on which the electronic component is mounted.

* * * * *